United States Patent [19]

Cramer et al.

[11] 3,750,150

[45] July 31, 1973

[54] PHOTOELECTRIC KEYBOARD FOR DATA INPUT DEVICES OR THE LIKE

[75] Inventors: Bernhard Cramer; Helmut W. Schilling, both of Pforzheim, Germany

[73] Assignee: International Standard Electric Corporation, New York, N.Y.

[22] Filed: July 21, 1972

[21] Appl. No.: 273,930

[30] Foreign Application Priority Data

Aug. 6, 1971 Germany .................. P 21 39 543.7

[52] U.S. Cl. .............. 340/365 P, 178/17 D, 197/98

[51] Int. Cl. .............................................. G06f 3/02

[58] Field of Search ............... 340/365 P; 178/17 D; 197/98; 179/90 K

[56] References Cited

UNITED STATES PATENTS

| | | | |
|---|---|---|---|
| 2,641,753 | 6/1953 | Oliwa | 340/365 P |
| 3,017,463 | 1/1962 | Dinsmore et al. | 340/365 P |
| 3,253,087 | 5/1966 | McIntosh | 340/365 P |
| 3,465,099 | 9/1969 | Harris | 340/365 P |
| 3,579,047 | 5/1971 | Sturm | 340/365 P |
| 3,617,627 | 9/1971 | McLean | 340/365 P |

*Primary Examiner*—John W. Caldwell
*Assistant Examiner*—Robert J. Mooney
*Attorney*—C. Cornell Remsen, Jr. et al.

[57] ABSTRACT

A photoelectric keyboard in which operation is achieved by insertion of a shutter in the light path between a source and a photocell in response to operation of a key. The shutter has pedetermined light transmissivity. Operation of a second key before the first is released inserts a second shutter in the light path and reduces the received light level below a predetermined threshold at the photocell so that ambiguous code generation does not occur during key overlap. So-called "key locks" are, therefore, unnecessary and individual styles of writing, including the "Legato-Writing", are not inhibited.

6 Claims, 3 Drawing Figures

PHOTOELECTRIC KEYBOARD FOR DATA INPUT DEVICES OR THE LIKE

BACKGROUND OF THE INVENTION

1. Field of the Invention

The present invention relates to a photoelectric keyboard for data input devices or the like in which, by operation of a key, a coded shutter mask is moved in the paths of light beams extending parallel to each other and directed to photocells.

2. Description of the Prior Art

Keyboards of the general type to which the invention applies are well known. German Petty Patent 1,816,744 and German printed application 1,252,729 show such prior art devices. In these and all other known designs, key and coded shutter mask form a unit, so that, according to the respective key operation, the associated shutter mask moves into the paths of selected light beams and remains there until the key is released.

To prevent any superposition of two characters entered in close succession, which would inevitably result in ambiguous coding, such keyboards have been provided with so-called "key locks", which lock all other keyboard elements for the duration of a given key operation.

These locks, which mostly operate on a mechanical basis, hamper the individual manner of writing, particularly the so-called "Legato-Writing" (depressing the next key before releasing the previous one). Accordingly, machines with such keyboard locking are more difficult to operate and tend to require special skill. In addition, a key lock arrangement adversely affects flexibility and the ease of operation of a keyboard and unnecessarily increases the cost of the device.

The manner in which the present invention eliminates the prior art disadvantages will be appreciated as their description proceeds.

SUMMARY

It may be said to be the general object of the invention to provide a photoelectric keyboard in which a key lock can be dispensed with the ambiguous coding resulting from keying overlap being provided by a more flexible electrical interlocking arrangement.

The invention is characterized in that the shutters have a predetermined absorption or light attenuation factor, which is selected so that if two or more shutters move successively in the way of the same light beam, a brightness discontinuity takes place which is evaluated at the photocell end. Each photocell is followed by several threshold switches whose threshold values lie, in a stepped manner, between the electrical signals from the photocells analogous to the several brightness values.

The principal advantage achieved by the invention is that, even in the case of a superposition of the entered characters caused by keys being operated in quick succession, these characters are recognized and evaluated so that the aforementioned key lock arrangement of the prior art can be dispensed with. This makes each individual manner of writing acceptable and insures that the special ease of operation, which is an inherent characteristic of photoelectric keyboards, can be fully available to the operator.

The invention will hereinafter be explained in more detail with reference to a typical embodiment thereof and in connection with the accompanying drawings.

DESCRIPTION OF THE PREFERRED EMBODIMENT

Figure 1:
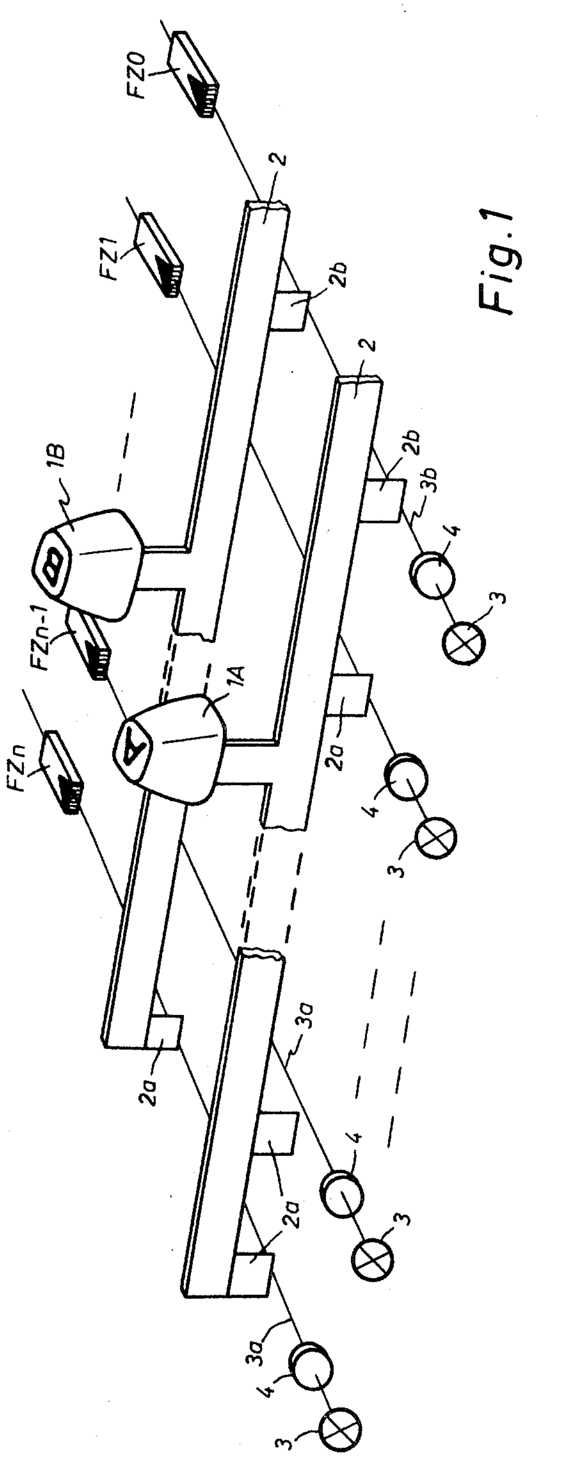
FIG. 1 is a perspective partial view of keyboard structure in accordance with the invention.

As can be seen from FIG. 1, the construction of the keyboard with which the invention is used (which, for reasons of clarity, is limited to two key elements), is of the conventional type. Light from light sources 3, arranged side-by-side, is typically collected by means of parabolic mirrors (not shown) and, via lens systems 4, to be concentrated into light beams *3a* and *3b*. These beams are directed to photocells FZ*o* and FZ1 to FZ*n*. Positioned above these light beams are vertically adjustable, coded shutter masks 2, which are held in the position shown by conventional guides and springs (not shown). Each mask 2 is provided with a key button, in this case key buttons A and B, and forms therewith key elements $1_A$ and $1_B$, respectively. The shutters *2a* and *2b*, aligned with the light beams *3a* and *3b*, are removable, in known manner, in accordance with the respective entered character. The shutters are made of a partially light-absorbing material which, in the present example, is assumed to have an absorption factor of 50 percent.

Figure 3:
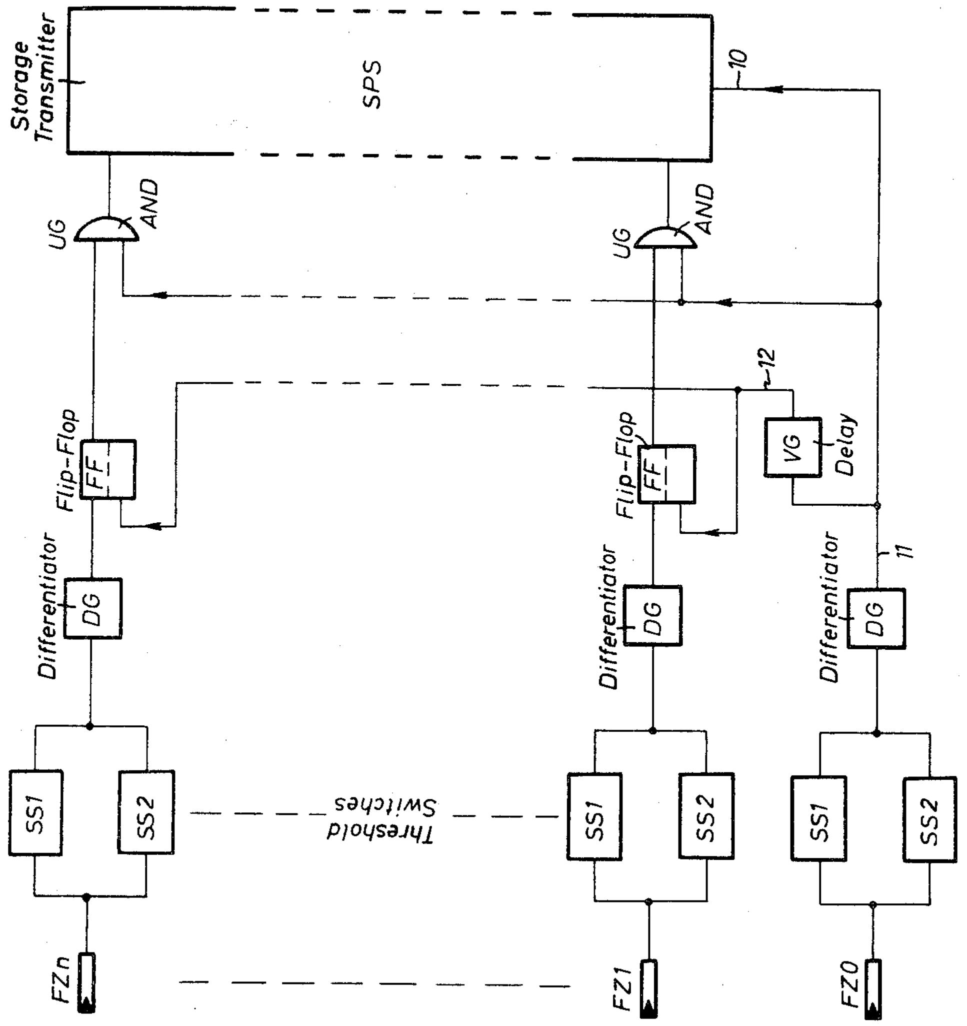
FIG. 3 shows the evaluating circuit connected to the photocells of FIG. 1 in accordance with the invention.

As shown in FIG. 3, each of the photocells FZ1 to FZ*n* (*n* = number of code bits) is followed by paralleled threshold switches SS1 and SS2, which are connected via a differentiator DG to a flip-flop FF. At the output end, each flip-flop is connected to one input of an AND-gate UG. The outputs of all AND-gates UG are connected to storage levels in a storage transmitter SPS. The latter causes the characters entered irregularly as a result of the individual manner of writing to be buffered, produces their parallel-to-serial conversion, and effects transmission at the transmitter clock rate.

The photocell FZ*o*, too, is followed by two parallel-connected threshold switches SS1 and SS2 as well by a differentiator DG. At the output end, this differentiator is connected, on the one hand, to the respective second input of all AND-gates UG via lead 11 and, on the other hand, via a delay VG and lead 12 to the reset input of all flip-flops FF. At the same time, it is conductively connected to the storage transmitter SPS for triggering the transmitter via lead 10.

Figure 2:
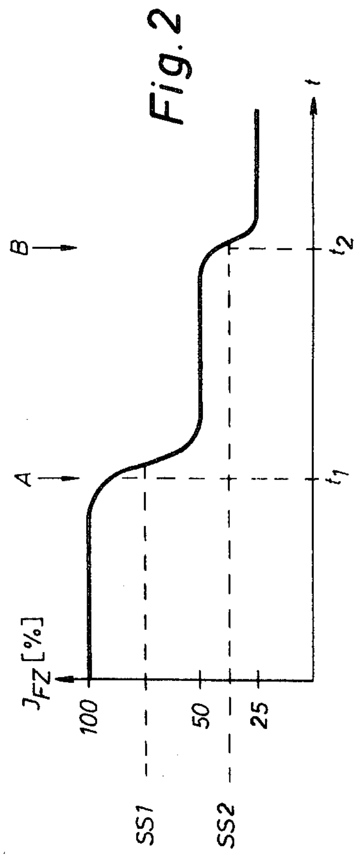
FIG. 2 is a plot of photocell current against time.

If, in the arrangement described, the key $1_A$ shown in FIG. 1, is operated, the code shutters *2a* and the associated shutter *2b* move into the light beams *3a* and *3b*, respectively. As a result of the assumed absorption factor of the shutter material of 50 percent, an analogous change takes place in the output signals of the respective photocells FZ*o* and FZ1 to FZ*n*. This process is illustrated in FIG. 2. The photocell current $J_{FZ}$ of the respective photocells, plotted against the time $t$, drops from 100 percent to 50 percent with the operation of the key $1_A$ at the instant $t_1$. Lying within this range is the threshold value of the respective indicated threshold switch SS1, which causes the following differentiator DG to deliver a trigger pulse, whereby the associated bistable flip-flop FF is changed to the 1-state. The code combination stored in the flip-flop FF is transferred to the storage transmitter SPS by activation of the following AND-gate UG with a trigger pulse which is triggered by the shutter *2b*, which subdues the light beam *3b* to the photocell FZ*o*. This trigger pulse simultaneously serves to initiate the transmitting operation and very shortly thereafter to change the flip-flops FF back to the 0-state via the delay VG. Now, the arrangement is ready to receive the next character.

The above-described process takes place in the microsecond range and is, therefore, extremely fast compared to any manual operation or movement of the keys. Thus, even in the case of an overlapping operation of the next key (in the example key $1_B$) at the instant $T_2$, no superposition of coding with the first character occurs. Instead, the shutters *2a* and *2b* of the mask 2 associated with the key 1*b*, move in the way of the light beams *3a* and *3b*, respectively. These beams are already subdued by the shutters of the mask 2 for the key $1_A$, but another downward jump in brightness of the residual light radiation by 50 percent is effected. Accordingly, the electric signal current of the photocells FZo and FZn decreases to 25 percent of its original intensity. Lying with the range of this change is the threshold value of the threshold switch SS2, as shown in FIG. 2, so that unambiguous recognition of the code combination and transfer to the storage transmitter SPS are effected in the manner described above. If light beams *3a*, are not affected by the key $1_A$ (key $1_A$ not depressed), but are influenced by operation of the key $1_B$, the same jump in brightness described in connection with key $1_A$ takes place. Accordingly, the threshold switches SS1 will respond to effect the corresponding code transfer to the transmitter SPS. The threshold switches SS1 and SS2 are typically circuits such as mono-stable multivibrators or Eccles-Jordan circuits which recognize an input variable crossing a threshold value to generate a step function signal.

Only in the case of key operation simultaneously (within a few microseconds) could ambiguity occur, but this possibility is so statistically unlikely that it need not be considered.

By suitably predetermining the absorption factor of the shutters *2a* and *2b*, it is easily possible to increase the permissible number of overlappingly operated keys. In practice, however, provision for a maximum of three sequences of characters appears to be sufficient. In that case, three threshold switches, whose threshold values are adjusted to the jumps in brightness or to the analogous output signals of the photocells, must be provided instead of two as in the example described.

What is claimed is:

1. In a manually operated system for producing relatively short duration electric pulses in response to insertion of a plurality of partially light transmissive shutters in series within a light beam illuminating a photocell, the combination comprising:

at least first and second threshold circuits connected to the output of said photocell, said first threshold circuit producing an output signal in response to the change of signal at the output of said photocell output resulting from insertion of a first of said shutters in said light beam, said second threshold circuit producing an output signal in response to the further reduction of said photocell output signal resulting from insertion of another of said shutters in said light beam while said first to be inserted shutter remains inserted;

means responsive to said outputs of said threshold circuits to produce an electric pulse of relatively short duration corresponding to a signal output from any of said threshold circuits.

2. A photoelectric keyboard system for data input and similar devices, having a first plurality of keys, a second plurality of photocells each arranged to be illuminated from a corresponding light source, and in which the light paths between said source and corresponding photocells are selectively, at least partially, interrupted in a predetermined pattern for generating a discrete electrical output code in response to operation of each key, comprising:

first means including a predetermined plurality of partially light transmissive shutters connected to be inserted discretely into the light paths of the photocells corresponding to the code to be produced when each of said keys is operated;

second means connected to the output of said photocells for contemporaneously generating a code pulse for each photocell providing an output signal change as a result of a first change of illumination produced by contemporaneous insertion of one of said shutters in the corresponding light path, said second means producing only one code pulse for each photocell output for each operation of said corresponding keys;

and third means responsive to a second change of illumination resulting from key operation inserting a shutter in any of said light paths in which another shutter remains inserted from previous operation of another key, for producing a code pulse for any corresponding photocell output, said third means producing only one code pulse for each photocell output thus diminished by two of said shutters.

3. Apparatus according to claim 2 in which said second means includes a first threshold switch connected one to each of said photocell outputs for producing an electrical step signal in response to insertion of one of said shutters in the corresponding light path and said third means includes a plurality of second threshold switch connected one to each of said photocell outputs for producing an electrical step signal in response to insertion of a second of said shutters while said first shutter remains in the corresponding light path, and differentiating means connected to the output of said threshold circuits to produce a relatively short pulse contemporaneously as each of said shutters is inserted into said light path.

4. Apparatus according to claim 3 in which said second means includes a differentiator and a flip-flop for each photocell, the outputs of said threshold circuits corresponding to each photocell being connected to said differentiator to produce a pulse at the time of each output signal change of said threshold circuits corresponding to insertion of each of said shutters in said corresponding light path for said photocell, and said flip-flop being connected to operate in response to said differentiator output to produce a standardized code pulse.

5. Apparatus according to claim 4 in which said flip-flop is a bistable circuit triggered by said differentiator output and in which one of said plurality of photocell, shutter, threshold circuit and differentiator combinations is arranged to operate in response to any of said key operations to produce a control pulse independent of said coding, and including delay means for delaying and applying said control pulse to said flip-flops as a reset pulse, thereby to determine the duration of said standardized code pulses.

6. Apparatus according to claim 5 in which each of said flip-flop outputs is applied to one input of an AND circuit, and the other inputs of all of said AND circuits are connected to receive said control pulse in undelayed form, the outputs of said AND circuits representing the coded output of said keyboard system.

* * * * *